(12) United States Patent
Koerner et al.

(10) Patent No.: US 12,418,159 B2
(45) Date of Patent: Sep. 16, 2025

(54) METHOD OF FABRICATING A VCSEL DEVICE AND VCSEL DEVICE

(71) Applicant: TRUMPF Photonic Components GmbH, Ulm (DE)

(72) Inventors: Roman Koerner, Lonsee (DE); Jenny Tempeler, Ulm (DE); Michael Smeets, Neu-Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 806 days.

(21) Appl. No.: 17/718,394

(22) Filed: Apr. 12, 2022

(65) Prior Publication Data

US 2022/0247152 A1 Aug. 4, 2022

Related U.S. Application Data

(63) Continuation of application No. PCT/EP2020/078400, filed on Oct. 9, 2020.

(30) Foreign Application Priority Data

Oct. 16, 2019 (EP) .................................... 19203671

(51) Int. Cl.
*H01S 5/00* (2006.01)
*H01S 5/02345* (2021.01)
(Continued)

(52) U.S. Cl.
CPC ...... *H01S 5/18322* (2013.01); *H01S 5/02345* (2021.01); *H01S 5/02476* (2013.01);
(Continued)

(58) Field of Classification Search
CPC ............. H01S 5/18322; H01S 5/02345; H01S 5/02476; H01S 5/04257; H01S 5/183;
(Continued)

(56) References Cited

U.S. PATENT DOCUMENTS

| 5,757,027 A * | 5/1998 | Kuchta .............. G01R 31/2822 372/50.1 |
| 2002/0028045 A1* | 3/2002 | Yoshimura .......... H01L 23/5389 385/39 |
| 2002/0039464 A1* | 4/2002 | Yoshimura .............. H01L 24/24 257/E25.032 |

(Continued)

FOREIGN PATENT DOCUMENTS

| CN | 107863294 A | 3/2018 |
| CN | 110137144 A | 8/2019 |
| FR | 3061354 A1 | 6/2018 |

*Primary Examiner* — Kinam Park
(74) *Attorney, Agent, or Firm* — LEYDIG, VOIT & MAYER, LTD.

(57) ABSTRACT

A method of fabricating a Vertical Cavity Surface Emitting Laser(VCSEL) device includes providing a first structure comprising a VCSEL layer structure on a wafer. The first structure has a non-planar first structure top surface with varying height levels and includes one or more electrical contact areas. The method further includes applying one or more layers of cover material on the non-planar first structure top surface with a thickness such that a lowest height level of a cover material top surface is equal to or above the highest height level of the non-planar first structure top surface, to obtain a second structure having a second structure top surface, planarizing the second structure top surface, and producing one or more first electrical vias from the second structure top surface through the one or more layers of cover material for electrical connection to the one or more electrical contact areas.

12 Claims, 14 Drawing Sheets

(51) Int. Cl.
*H01S 5/024* (2006.01)
*H01S 5/042* (2006.01)
*H01S 5/183* (2006.01)
*H01S 5/42* (2006.01)

(52) U.S. Cl.
CPC .......... *H01S 5/04257* (2019.08); *H01S 5/183* (2013.01); *H01S 5/18305* (2013.01); *H01S 5/18347* (2013.01); *H01S 5/18361* (2013.01); *H01S 5/423* (2013.01); *H01S 5/02469* (2013.01); *H01S 5/426* (2013.01)

(58) Field of Classification Search
CPC ............. H01S 5/18305; H01S 5/18347; H01S 5/18361; H01S 5/423; H01S 5/02469; H01S 5/426; H01S 5/028
See application file for complete search history.

(56) References Cited

U.S. PATENT DOCUMENTS

| | | | |
|---|---|---|---|
| 2002/0041740 A1* | 4/2002 | O'Connor | G02B 6/4249 385/88 |
| 2005/0094695 A1 | 5/2005 | Trezza et al. | |
| 2008/0048215 A1* | 2/2008 | Davies | H10D 89/713 257/274 |
| 2010/0032750 A1* | 2/2010 | Davies | H01L 23/10 257/329 |
| 2010/0215070 A1 | 8/2010 | Hattori | |
| 2017/0025580 A1 | 1/2017 | Huang et al. | |
| 2018/0083107 A1 | 3/2018 | Birner et al. | |
| 2018/0375287 A1 | 12/2018 | Kalifa et al. | |
| 2019/0244878 A1* | 8/2019 | Kim | H01L 23/5386 |
| 2020/0274321 A1 | 8/2020 | Ghegin et al. | |
| 2021/0134723 A1* | 5/2021 | May | H01L 23/293 |

* cited by examiner

METHOD OF FABRICATING A VCSEL DEVICE AND VCSEL DEVICE

CROSS REFERENCE TO RELATED APPLICATIONS

This application is a continuation of International Application No. PCT/EP2020/078400 (WO 2021/074027 A1), filed on Oct. 9, 2020, and claims benefit to European Patent Application No. EP 19203671.3, filed on Oct. 16, 2019. The aforementioned applications are hereby incorporated by reference herein.

FIELD

Embodiments of the present invention relate to a method of fabricating a Vertical Cavity Surface Emitting Laser (VCSEL) device, and to a VCSEL device.

BACKGROUND

VCSELs are a type of semiconductor laser diodes with laser beam emission perpendicular to the top or bottom surface. Typically, a VCSEL comprises two distributed Bragg reflector mirrors parallel to the wafer surface, and an active region comprising one or more quantum wells for the laser light generation arranged between the two distributed Bragg reflector mirrors. The DBR-mirrors typically comprise layers with alternating high and low refractive indices. In common VCSELs, the upper and lower mirrors are doped as p-type and n-type materials, forming a diode junction. In other conventional configurations, the p-type and n-type regions may be embedded between the DBRs. The overall VCSEL layer structure comprises one or more semiconductor materials. When fabricating a VCSEL device comprising one or more VCSELs (VCSEL array), the VCSEL layer structure is epitaxially grown on a wafer. The main part of the VCSEL fabrication process is the electrical isolation of one or more single VCSELs on the wafer. This is typically done by etching the VCSEL epitaxial structure, separating the p-n junction and thus creating a certain topology on the wafer. Depending on the type of VCSEL device, the semiconductor etching can be done multiple times at different points in the process sequence, creating topologies of the top surface of the wafer including the VCSEL layer structure with altitudes up to 15 μm. In order to inject carriers into the VCSEL, electrical contact areas to the n-type doped and p-type doped sides of the p-n junction have to be applied. This is conventionally done by depositing electrically conductive materials at different altitudes on the wafer including the VCSEL layer structure. To provide connection between the VCSEL device and the electrical driver, external electrical links need to be applied. This can be done directly by soldering, while the contact areas need to have a certain size, in order to sufficiently mount the soldering ball on the contact areas. However, VCSEL sizes tend to be smaller (20-30 μm) than a typical solder ball (50-60 μm). Moreover, the VCSEL itself is mechanical unstable, e.g. due to the previous oxidation process for forming a current aperture, thus the direct soldering on the VCSEL structure is impossible. For this reason, it has been necessary to reserve a certain bonding area. In the bonding area, the mechanical stability for the bonding process is given. The bonding area and the electrical contact areas are connected by electrical links on the VCSEL. While this layout enables different bonding techniques like soldering, bumps, etc., a disadvantage is that the VCSEL device fabricated in this way is multiple times larger in size than the actual VCSEL or VCSELs. This is because the metal tracks need to overcome the surface topology of the device, connecting the contact areas at multiple altitudes. Advanced routing concepts, e.g. to connect only certain VCSELs in a VCSEL array, require a large amount of space, additional electrical isolation and metal layers. The above-mentioned problems have been solved in common fabrication methods by reserving space on the VCSEL chip for soldering purposes, referred to as the bonding area. Electrical connection from the bonding areas to different altitudes of the VCSEL device are done by metal tracks. These tracks have to overcome the altitudes on the wafer including the VCSEL layer structure by graded etching profiles or specialized deposition processes. Thus, a state of the art VCSEL device requires ¼ of the footprint for the VCSEL itself, but ¾ of the footprint for bonding areas, metal tracks and support structures.

Thus, there is a need in an improved fabrication method and an improved VCSEL device.

SUMMARY

Embodiments of the present invention provide a method of fabricating a Vertical Cavity Surface Emitting Laser (VCSEL) device. The method includes providing a first structure comprising a VCSEL layer structure on a wafer. The first structure including the wafer comprising one or more semiconductor materials. The first structure has a non-planar first structure top surface with varying height levels along the non-planar top surface. The non-planar first structure top surface includes one or more electrical contact areas at different height levels above the wafer. The method further includes applying one or more layers of cover material different from the one or more semiconductor materials on the non-planar first structure top surface with a thickness such that a lowest height level of a cover material top surface is equal to or above the highest height level of the non-planar first structure top surface, to obtain a second structure comprising the first structure and the one or more layers of cover material. The second structure has a second structure top surface. The method further includes planarizing the second structure top surface, and producing one or more first electrical vias from the second structure top surface through the one or more layers of cover material for electrical connection to the one or more electrical contact areas.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIGS. 1A-1G schematically show side views of a process sequence of an embodiment of a method of fabricating a VCSEL device, wherein FIG. 1G shows the fabricated VCSEL device in a side view;

FIGS. 2A-2C schematically show side views of a processing sequence of another embodiment of a method of fabricating a VCSEL device, wherein FIG. 2C shows the fabricated VCSEL device in a side view;

FIGS. 3A-3D schematically show side views of a processing sequence of another embodiment of a method of fabricating a VCSEL device, wherein FIG. 3D shows the fabricated VCSEL device in a side view;

FIGS. 4A-4J schematically show side views of a processing sequence of another embodiment of a method of fabricating a VCSEL device, wherein FIG. 4J shows the fabricated VCSEL device in an side view;

FIGS. 5A-5D schematically show a processing sequence of another embodiment of a method of fabricating a VCSEL device, wherein FIG. 5A-5C show side views and FIG. 5D shows the fabricated VCSEL device in a top view;

FIGS. 6A-6H schematically show a processing sequence of another embodiment of a method of fabricating a VCSEL device, wherein FIG. 6A-6G show side views and FIG. 6H shows the fabricated VCSEL device in a top view;

FIGS. 8A-8B show a VCSEL device fabricated according to embodiments of the present invention; wherein FIG. 8A is a side view and FIG. 8B is a top view;

DETAILED DESCRIPTION

Figure 1A:
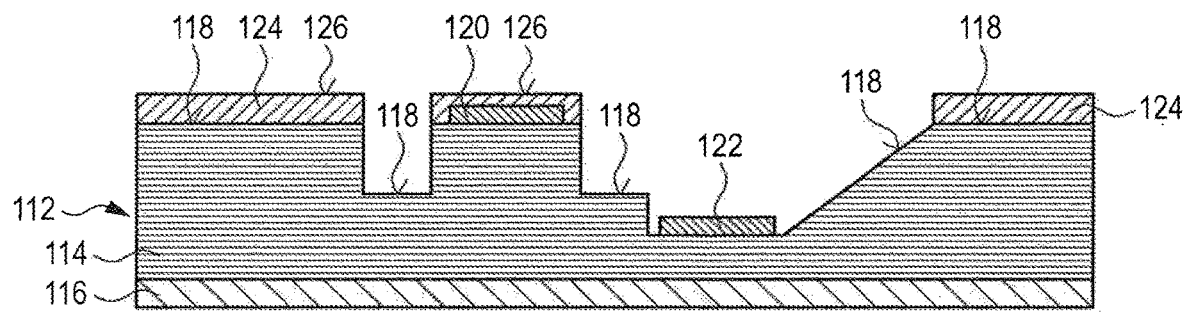

Embodiments of the present invention provide a fabrication method which enables fabrication of a VCSEL device having a reduced footprint.

According to a first aspect, a method of fabricating a vertical cavity surface emitting laser (VCSEL) device includes:
  providing a first structure comprising a VCSEL layer structure on a wafer, the first structure including the wafer comprising one or more semiconductor materials, the first structure having a non-planar first structure top surface with varying height levels along the non-planar top surface, wherein the non-planar first structure top surface comprises one or more electrical contact areas at different height levels above the wafer;
  applying one or more layers of cover material different from the one or more semiconductor materials on the non-planar first structure top surface with a thickness such that a lowest height level of a cover material top surface is at least equal to or above the highest height level of the non-planar first structure top surface, to obtain a second structure comprising the first structure and the one or more layers of cover material, the second structure having a second structure top surface;
  planarizing the second structure top surface;
  producing one or more first electrical vias from the second structure top surface through the one or more layers of cover material for electrical connection to the one or more electrical contact areas.

The method may be carried out in a different order than indicated above. The method may comprise further processing steps before, between and after the steps indicated above. The method according to the invention proposes a new concept of fabricating VCSEL devices which results in VCSEL devices with smaller footprint. The method according to the invention provides to planarize the non-planar top surface of the initial structure of wafer and VCSEL layer structure. Planarization is performed by applying one or more layers of cover material onto the non-planar top surface of the initial (first) structure. The cover material is then worked to provide a planarized second structure comprising the initial VCSEL wafer structure and the one or more layers of cover material. Thus, the second structure has a planar top surface. One or more electrical bonding areas for externally connecting the VCSEL device with a driver, may be arranged directly on top of the planarized VCSEL chip in electrical contact with the electrical vias, thereby reducing the footprint significantly.

The method according to embodiments of the present invention is not only applicable for VCSEL devices with a single mesa or VCSEL, but also for VCSEL arrays having multiple mesas. Embodiments of the present invention enable single-addressable VCSELs in an array on one chip.

Further, the planarization allows for improving heat-transfer by direct-external connection to a heat sink. Furthermore, a VCSEL device fabricated according to embodiments of the present invention allows for shorter electrical connection between the VCSEL device and an external driver. A shorter electrical connection reduces parasitic capacitances. A further advantage is that internal routing of electrical links within the VCSEL device. i.e. below the top surface of the VCSEL device, is enabled by repeating the planarization sequence multiple times, as will be described herein.

A further advantage is the improved mechanical stability of the VCSEL device due to the cover material.

The method according to embodiments of the present invention may start with an electrically functional VCSEL device on wafer. The VCSEL layer structure comprises one or more semiconductor materials, preferentially II-VI or III-V compound semiconductor materials. For example, the wafer may be a GaAs wafer, and the VCSEL layer structure may comprise GaAs and AlGaAs or InGaAs layers. The cover material or cover materials may be chosen such that it is suitable for being worked, preferentially for being polished, in particular chemically mechanically polished using a slurry. The slurry may contain small particles of the cover material(s).

The VCSEL layer structure may be epitaxially grown on the wafer and then be etched to produce the first structure. The VCSEL layer structure may comprise distributed Bragg reflectors, one or more active regions comprising one or more quantum wells, one or more integrated photodiode layer or phototransistor layer structures. The one or more electrical contact areas are provided for electrically contacting layers of the VCSEL layer structure with different polarities, e.g. for contacting p-regions and n-regions of the VCSEL layer structure.

The second structure top surface may be the outermost surface of the final VCSEL device, or may be an intermediate surface, when the application of cover material layers and planarization is repeated one or more times.

In the following, various embodiments of the method according to invention will be described.

In an embodiment, the planarizing comprises polishing, in particular chemical mechanical polishing the second structure top surface.

The method may further comprise, prior to applying the one or more layers of cover material, applying a working stop layer. Such a working stop layer may be applied on the non-planar first structure top surface preferentially in areas with the highest height levels of the VCSEL layer structure. The working stop layer advantageously avoids unwanted removal of material from the VCSEL layer structure.

The working stop layer preferentially comprises a material which is different from the cover material to be worked so that, when working, e.g. polishing the cover material with a slurry containing small particles of the cover material, the slurry does not remove material from the working (polishing) stop layer.

During working the cover material, the wafer may be fixed from the back side by an adhesive tape, vacuum mounting or by arranging it on an appropriate carrier substrate to prevent mechanical damage to the wafer.

In an embodiment, the planarization may comprise applying a first layer of cover material, working the first cover material top surface to provide a planar first cover material top surface, and applying a second layer of cover material on the planar first cover material top surface to provide a second cover material top surface.

The second cover material may be a electrically isolating and thermally conducting. The second cover material layer may provide electrical isolation of the VCSEL chip or wafer and, in particular, mechanical stability. The second layer preferentially is sufficiently thick, e.g. 100-200 nm, to provide sufficient mechanical stability, but should not be too thick in order to avoid a high altitude of the VCSEL device.

In some embodiments, at least one of the layers of cover material may be electrically isolating. The advantage here is that the cover material may also provide an electrical isolation of areas or regions of the VCSEL device having different polarities, and/or provides electrical isolation between mesas of a VCSEL array device.

In other embodiments, at least one of the layers of cover material may be metallic, and thus, electrically conductive. By working, e.g. polishing the metal cover material with a suitable polishing agent, planarization may be performed as it is the case with an electrically isolating cover material. An advantage of using a metal as the cover material is that at least part of vias from the final top surface of the VCSEL chip to the contact areas lying on lower height levels may be provided by the metal layer so that processing may be simplified.

It is to be understood, that applying one or more layers of metallic cover material on the non-planar first structure top surface may be combined with application of one or more layers of electrically-isolating cover material.

Further, at least one of the layers of cover material may be thermally conducting. Thus, heat discharge and connection to a heat sink may be simplified and more effective.

The first electrical vias may be produced by etching one or more contact holes into the one or more layers of cover material down to the one or more electrical contact areas and filling the one or more contact holes with an electrically conducting material, e.g a metal, up to the second structure top surface.

Producing the contact holes may be carried out by etching the second structure, e.g. by plasma assisted dry etching (RIE/ICP), thereby exposing the one or more electrical contact areas on the bottom of the contact holes. The etching chemicals are thereby not attacking the bottom contact areas, thus creating a self-terminating edging process. A cleaning step may follow for cleaning the contact hole openings, using e.g. wet-chemical cleaning with HCL or $H_2SO_4$, or plasma cleaning with $O_2/Ar/NH_3$.

Filling the contact holes with an electrically conducting material may be performed galvanically. To do so, a metal film serving as a galvanic seed layer may be applied to provide electrical conductivity for the galvanic contact hole filling. Before galvanically filling the contact holes, the contact holes may be filled up with a protective coating, e.g. by atomic layer deposition or sputtering to create a layer on the walls of the contact holes with a thickness of several nm. This layer may be advantageous as it may absorb residual stress created by the galvanic contact hole filling. Further, it may provide adhesion and inhibit diffusion of material from optional subsequent application of further material(s) onto the second structure.

The method according to embodiments of the present invention has the further advantage of allowing forming electrical links or electrical routings within and on top of the VCSEL chip. In particular, complex internal routing of electrical links can be performed by repeating the planarization sequence two or more times. This allows e.g. for photonic component (like photodiode or phototransistor) integration in the VCSEL device, for electrical connection of a part or all of a plurality of mesas of the VCSEL device with one another, and/or to provide multi-level connections for tunnel diodes, coupled active regions, intra-cavity components and the like.

In an embodiment, the method according to embodiments of the present invention may further comprise, after producing the one or more first electrical vias, applying at least one further layer of cover material on the second structure to provide a third structure comprising the second structure and the further cover material, the third structure having a third structure top surface. In this embodiment, the second structure top surface is an intermediate surface of the VCSEL device.

The method may further comprise producing further electrical vias through the planar third structure top surface down to at least a part of the first electrical vias for electrically connecting the one or more further electrical vias.

In the context of the afore-mentioned embodiments, the method may further comprise, prior to applying the further cover material, electrically connecting at least a part of the first electrical contacts on the planar first structure top surface with one another. Thereby, an internal electrical routing between e.g. multiple mesas arranged on the VCSEL chip is enabled.

The afore-mentioned processing steps may be repeated several times, in order to create internal electrical connections, e.g. between multiple mesas, or photonic components integrated into the VCSEL chip in a multitude of height levels above the wafer. Thus, the afore-mentioned embodiments are particularly advantageous for producing VCSEL arrays having a multitude of VCSELs or mesas. Embodiments of the present invention allows to make internal connections in the VCSEL array, e.g. to connect mesas with one another, while the external link to the driver is executed directly above the VCSEL chip, thus creating dense packet VCSEL arrays with only a low number of contacts or bond areas being necessary.

According to a second aspect, a Vertical Cavity Surface Emitting Laser (VCSEL) device includes:
  a first structure comprising a VCSEL layer structure on a wafer, the first structure including the wafer comprising one or more semiconductor materials, the first structure having a non-planar first structure top surface with varying height levels along the non-planar top surface, wherein the non-planar top surface comprises one or more electrical contact areas at different height levels;
  one or more layers of cover material different from the one or more semiconductor materials arranged on the non-planar first structure top surface, wherein an uppermost top surface of the VCSEL device is planar,
  one or more first electrical vias from the uppermost top surface through the one or more layers of cover material in electrical connection with the one or more contact areas.

The VCSEL device according to embodiments of the present invention has the same or similar advantages as the method according to the first aspect.

In particular, the VCSEL device according to embodiments of the present invention has a footprint which is significantly reduced in comparison with conventional VCSEL devices, e.g. by a factor of 2 or more. The VCSEL device according to embodiments of the present invention may comprise a single mesa, or a plurality of mesas to provide a VCSEL array which is densely packed. Other configurations like integration of photodiode/phototransistor structures are also possible, as well as VCSEL devices with multi-wavelength emission.

The one or more layers of cover material may include one or more electrically isolating layers and/or one or more electrically conductive layers.

The VCSEL device may comprise one or more internal electrical links electrically connecting one or more of the vias at a height level below the uppermost top surface and above the wafer.

The VCSEL device may comprise one or more bonding areas on the uppermost top surface in electrical connection with the one or more electrical vias.

The VCSEL device may be a bottom emitter or a top emitter. The VCSEL device may be fully enclosed by an electrical isolating and thermal conductive material formed by the one or more layers of cover material as indicated above.

Further features and advantages will become apparent from the following description of exemplary embodiments with reference to the drawings.

In the following, several embodiments of VCSEL devices and embodiments of a method of fabricating the VCSEL devices will be described.

A first embodiment of a method of fabricating a VCSEL device 100 will be described with reference to FIGS. 1A-1G. FIG. 1G shows the VCSEL device 100 fabricated according to the method.

According to FIG. 1A, a first structure 112 is provided. The first structure 112 comprises a VCSEL layer structure 114 on a wafer 116. The VCSEL layer structure 114 including the wafer 116 comprise one or more semiconductor materials. As an example, the wafer 116 may be a GaAs-wafer, and the VCSEL layer structure 114 may comprise layers of GaAs and AlGaAs. Other semiconductor materials chosen from the group of II-VI or III-V compound semiconductors are conceivable as materials for the first structure 112.

The VCSEL layer structure 114 may be epitaxially grown on the wafer 116 according to known techniques. The VCSEL layer structure 114 may comprise distributed Bragg reflectors and one or more active regions comprising one or more quantum wells as known in the art. As shown in FIG. 1A, the VCSEL layer structure 114 may be provided as an electrical functional VCSEL structure, i.e. it is ready for laser emission if connected with a driver. In the process of fabricating a VCSEL device like the VCSEL device 100, the VCSEL layer structure 114 is etched into the epitaxial layer structure, in order to separate the p-n junction of the VCSEL layer structure 114, whereby a certain topology of the first structure is created. Accordingly, the first structure 112 has a non-planar first structure top surface 118 with varying height levels along the non-planar top surface 118. The first structure 112 is provided with one or more electrical contact areas 120, 122. The contact areas 20, 22 may be provided as contact areas with different polarity. Contact area 20 for example may be a p-contact area, and contact area 22 may be a n-contact area. The one or more electrical contact areas 120, 122 are provided for electrically contacting regions of the VCSEL layer structure 114 of different polarities, e.g. for contacting p-regions and n-regions of the VCSEL layer structure 114.

The non-planar topology of the surface 118 of the first structure 112 and, thus, the arrangement of the contact areas 120, 122 in different height levels above the wafer 116 makes it difficult to apply external electrical links for connection with an electrical driver (not shown). In particular, applying solder balls on the contact areas 120, 122 in the state of the first structure 112 shown in FIG. 1A would require much space, as soldering balls typically have a size of 50-60 µm, while VCSEL sizes tend to be smaller, for example 20-30 µm. This means that applying external links to the first structure 112 would require ¾ of the VCSEL device size as the footprint for bonding areas, while the VCSEL itself would only make ¼ of the footprint.

The fabrication method described hereinafter solves this problem.

After the final topology of the first structure is reached in the front-end process sequence, the first structure 112 may be covered with a layer of cover material 124, which preferentially is mechanical stable and electrically isolating. The material 124 is applied along a part of the non-planar first structure top surface 118 as shown in FIG. 1A. As can be seen in FIG. 1A, the material 124 is applied on the non-planar first structure top surface 118 in areas where the top surface 118 has the highest height levels. A top surface 126 of the material 124 defines the highest level of the non-planar top surface 118. The material 124 serves as a stop layer when the top surface 118 is worked, in particular polished, in a subsequent process step which will be described below. The material 24 may be nitride-based, for example AlN or SiN.

Figure 1B:
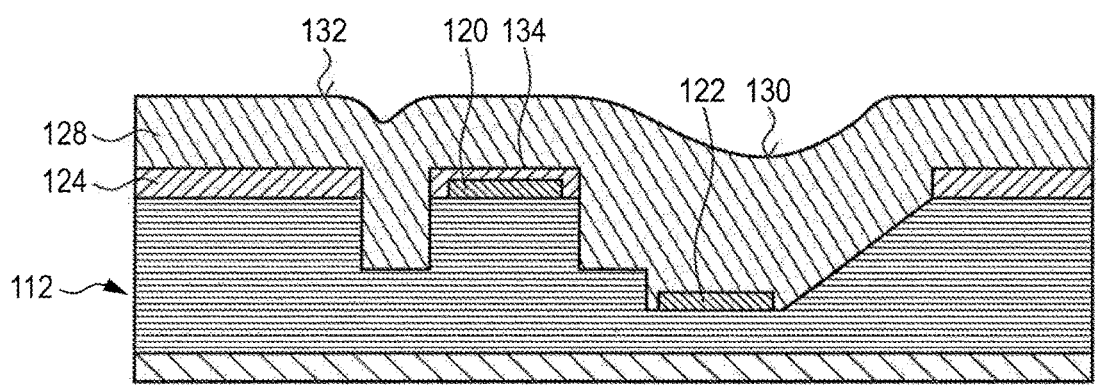

Next, according to FIG. 1B, a layer of cover material 128 different from the semiconductor material or materials of the VCSEL layer structure 114 and wafer 116 is applied on the non-planar first structure top surface 118 including the top surface 126 of the material 124 along the non-planar first structure top surface 118, 126. The cover material 128 is applied with a thickness such that a lowest height level 130 of a cover material top surface 132 is at least equal to or above the highest level 134 of the non-planar first structure top surface 118, 126, as shown in FIG. 1B.

In the present embodiment, the cover material 128 is electrically isolating. The cover material 128 may be an oxide-based material, for example $Al_2O_3$ or $SiO_2$. The cover material 128 may be applied by conformal sputtering or chemical vapor deposition (CVD), implementing minimal stress into the underlying VCSEL layer structure 114.

Figure 1C:
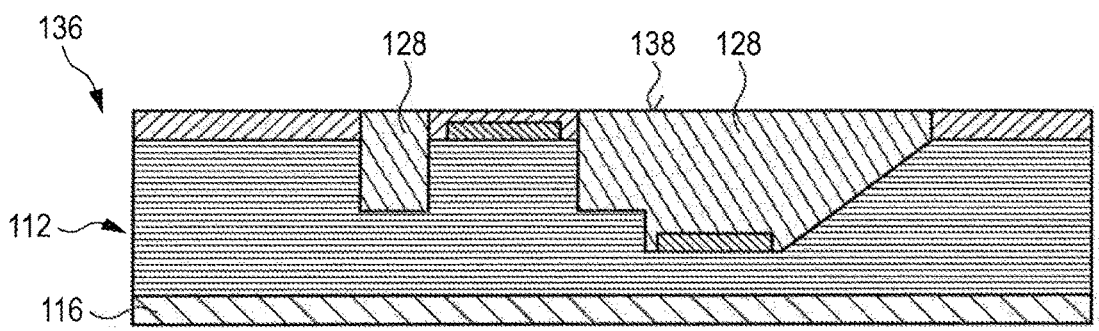

The next step is a planarization step shown in FIG. 1C. Planarization is performed by working the cover material top surface 132, whereby a second structure 136 is provided which comprises the first structure 112 and the cover material 128. Working the cover material top surface 132 may be performed by chemical mechanical polishing using a slurry. The slurry may contain small particles of the cover material 128. As mentioned above, the material 124 acts as a polishing stop layer so that unwanted removal of material of the VCSEL layer structure 114 is avoided. The second structure 136 comprises a second structure top surface 138 which is planar. In other words, the second structure 136 has a planarized topology in contrast to the non-planar topology of the first structure 112.

In the present embodiment, a further layer of cover material 140 is applied onto the planar second structure top surface 138. The cover material 140 may be an electrically isolating material. The thickness of the cover material 140 should be sufficient, e.g. 100-200 nm, to provide mechanical stability, but it should not be too thick to create a high topology above the wafer 116. The cover material 140 may be nitride-based, and may comprise AlN or SiN, for example. After the cover material 140 is applied, the planar second structure top surface 138 is now formed by the top surface of the cover material 140, which is labeled with reference numeral 138 again, as indicated in FIG. 1D.

Figure 1D:
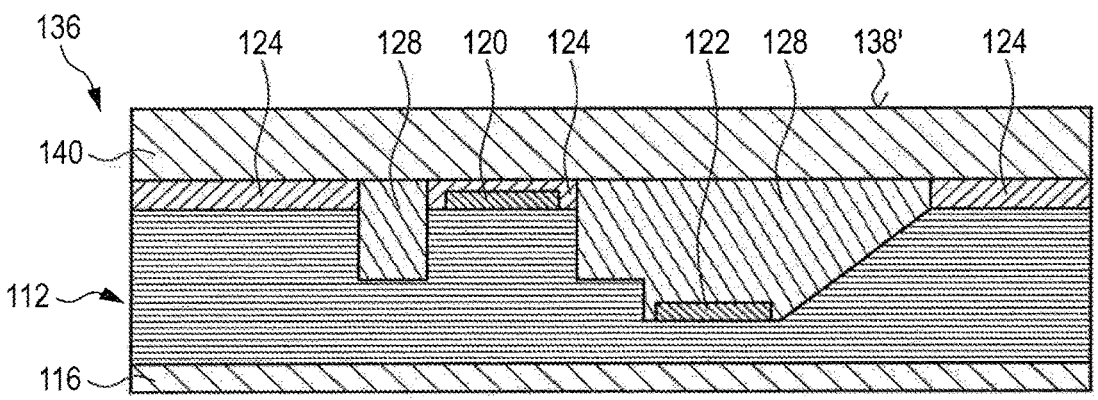
Figure 1E:
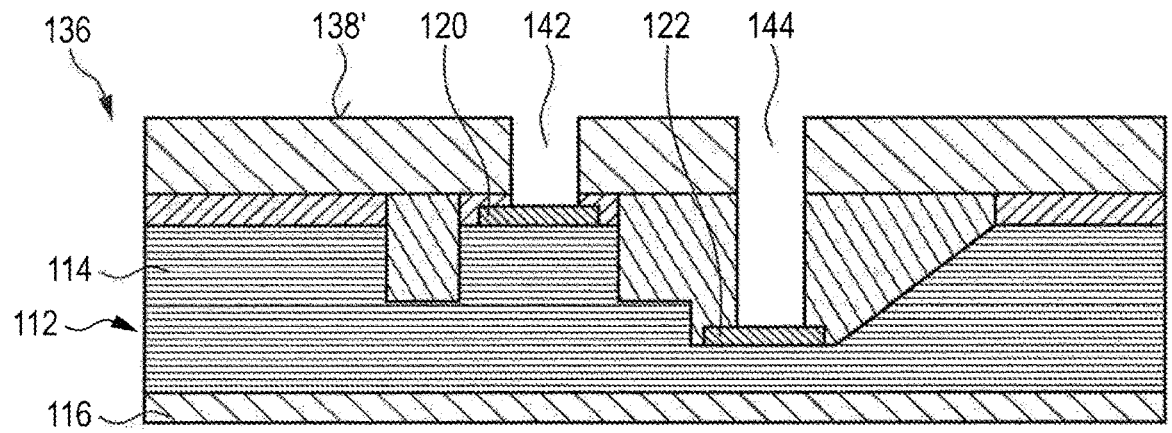

In the process state of FIG. 1D, the contact areas 120, 122 are buried or embedded in the second structure 136. Electrical vias to the contact areas 120, 122 will be produced in the next step according to FIG. 1E. In this process, contact holes 142, 144 are produced by etching, for example by plasma assisted dry etching (RIE/ICP) whereby the contact areas 120 and 122 are exposed at the bottom of the contact holes 142, 144. Etching chemicals are preferentially used which do not attack the contact areas 120, 122, and thus, the etching process is self-terminating. The contact holes 142, 144 may be cleaned thereafter by, e.g., wet-chemical HCl or $H_2SO_4$ cleaning, or by plasma cleaning with $O_2/Ar/NH_3$.

Figure 1F:
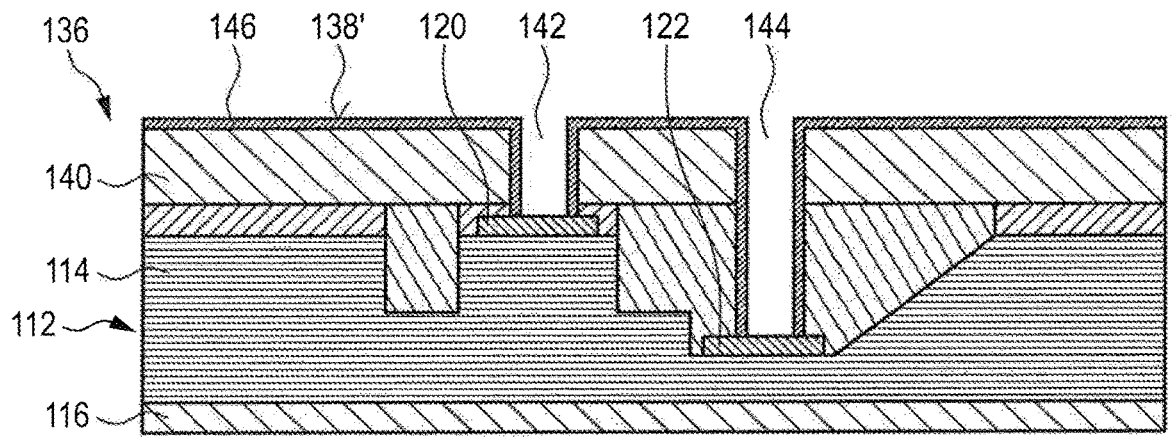
Figure 1G:
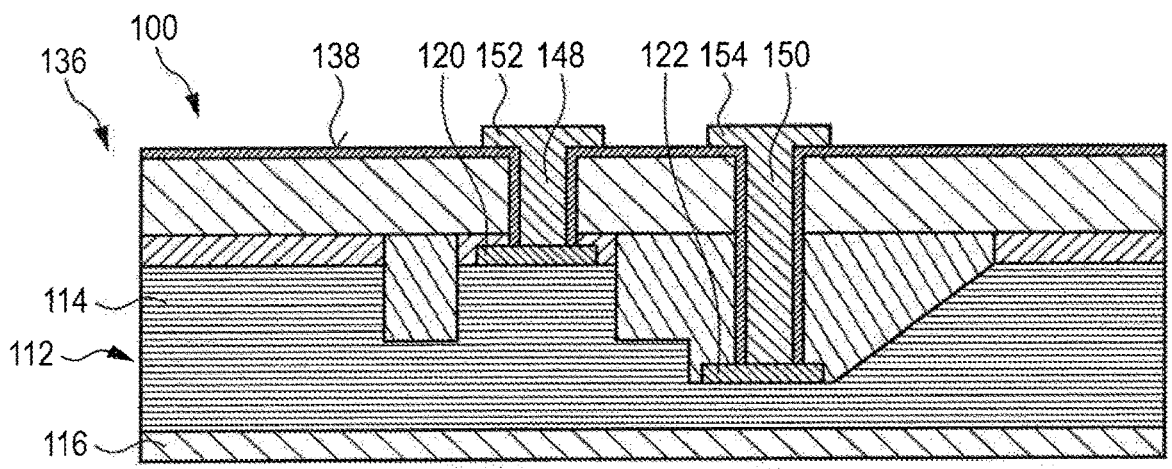

Next, according to FIG. 1F, a layer of protective material 146 is applied as coating onto the second structure top surface 138 then is formed by the top surface of the protective coating 146. The protective coating 146 also covers the walls of the contact holes 142, 144. The protective coating may be based on nitride, and may comprise AlN or SiN, for example. The deposition of the protective coating 146 should be conformal, creating a layer with 5-10 nm thickness. Material deposition may be performed by atomic layer deposition (ALD) or sputtering. The protective coating 146 may absorb residual stress created by the subsequent steps, provide adhesion and inhibit the fusion of material deposited in the subsequent step(s).

Next, a metal film may be applied (not shown) as a galvanic seed layer to provide electrical conductivity for galvanically filling the contact holes 142, 144 with an electrically conducting material. Then, the contact holes 142, 144 are filled with the electrically conducting material in a galvanic process. By filling the contact holes 142, 144 with an electrically conducting material, vias 148, 150 are created through the planar second structure top surface 38 down to the electrical contact areas 120, 122.

Bonding areas 152, 154 may be provided on the planar second structure top surface 138, as shown in FIG. 1G. The second structure top surface 138 forms the uppermost top surface of the VCSEL device 100 in this embodiment. The bonding areas 152, 154 may be provided with solder balls (not shown) for connecting electrical links to an external driver (not shown). Thus, the VCSEL device 10 is fabricated, wherein the VCSEL device 10 is fully enclosed by electrical isolating and thermally conductive material 128, 140, 146. In particular, the bonding areas 152, 154 for bonding the VCSEL device 10 to e.g. an external driver, is located directly above the VCSEL device or chip 100, thus reducing the footprint of the bonding area by a factor of two or more in comparison with prior art VCSEL devices.

Figure 2A:
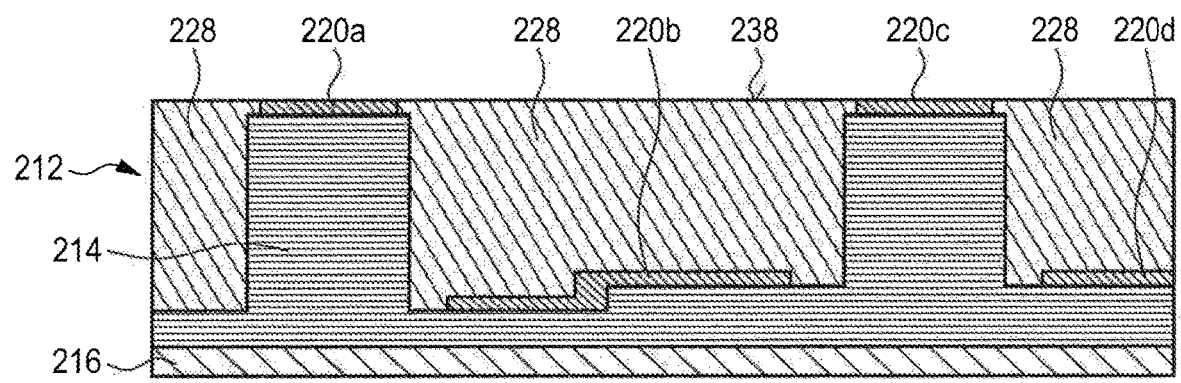
Figure 2B:
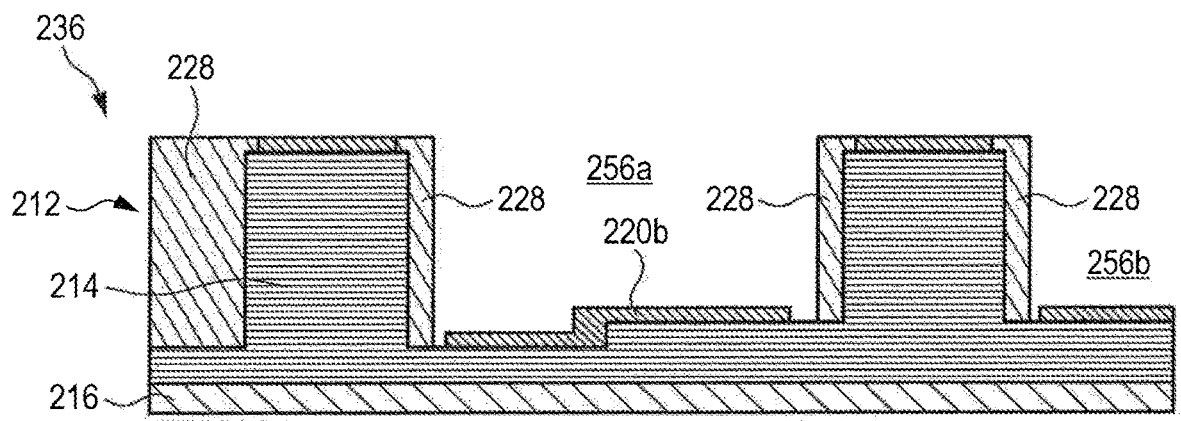
Figure 2C:
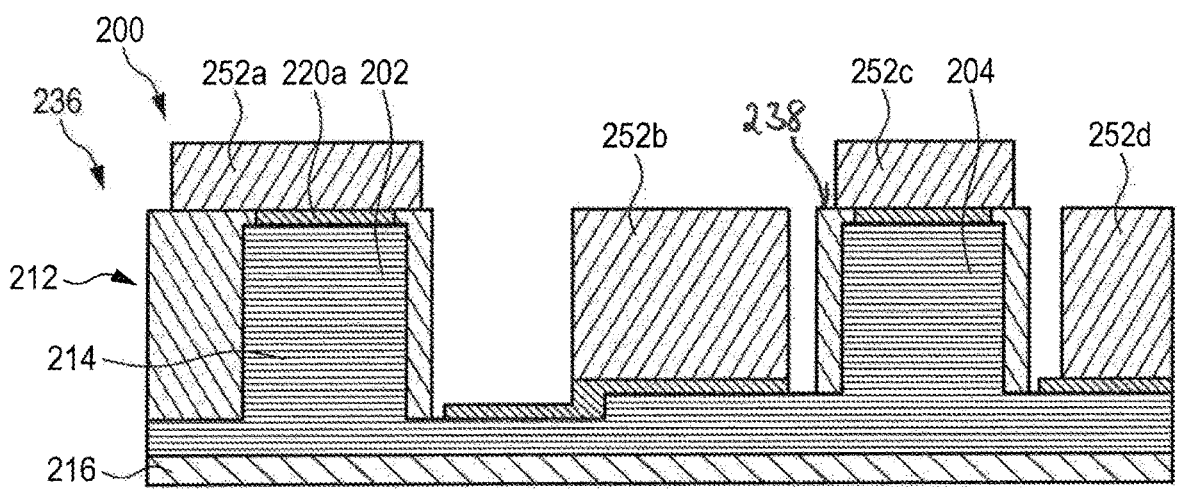

FIGS. 2A-2C show another embodiment of a method of fabricating a VCSEL device 200 shown in FIG. 2C. The embodiment of FIG. 2A-2C is a modification of the embodiment described before. The VCSEL device 200 comprises a first structure 212 comprising a VCSEL layer structure 214 on a wafer 216. The layer structure 214 comprises two mesas 202, 204, each forming a VCSEL.

FIG. 2A shows a state of the method of fabricating the VCSEL device 200 which corresponds to the state in FIG. 1C of the method described above, i.e. the processing sequence in FIGS. 1A and 1B is omitted here for the sake of simplification. FIG. 2A thus shows the VCSEL structure (second structure) 236 which has been planarized before as described above so that it has the planar second structure top surface 238. A working (polishing) stop layer is not shown here, but may be provided as described above.

In the present embodiment, the first structure 212 includes electrical contact areas 220a, 220b, 220c and 220d. Starting from the state of the VCSEL structure 236 in FIG. 2A, a part of the layer of cover material 228, which is electrically isolating, is removed in a region 256a and 256b by etching, thus exposing areas of the VCSEL structure 236 which are intended for further processing, while the cover material electrically further isolates and encapsulates the mesas 202, 204. The regions 256a, 256b are then filled or partially filled with electrically conducting material up to the height level of the planar second structure top surface 238 to provide vias 252b and 252d. The planar second structure top surface 238 forms the uppermost top surface of the VCSEL device 200. Bonding areas 252a and 252c may then be arranged on the contact areas 220a, 220c, and the upper surfaces of the vias 252b and 252d may be used as bonding areas. Thus, all bonding areas are arranged on top of the VCSEL device 200 in a dense pack.

FIGS. 3A-3D show another embodiment of a method of fabricating a VCSEL device 300 as a modification of the previous embodiments. Like in the previous embodiment, the VCSEL device 300 comprises two mesas 302, 304. The first structure 312 comprises the VCSEL layer structure 314 on wafer 316. The first structure comprises contact areas 320a, 320b, 320c, 320d. In the embodiment according to FIGS. 3A-3D, planarization of a VCSEL structure is shown with a layer of metallic cover material, as will be described below.

Figure 3A:
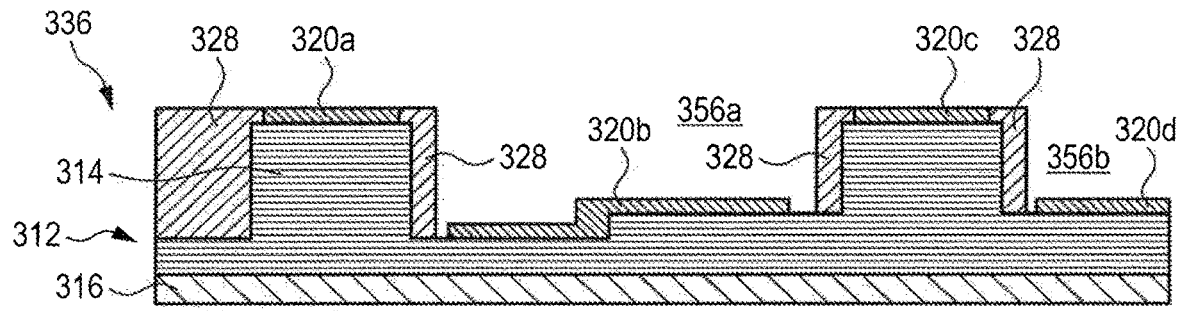

The description starts with reference to FIG. 3A in a process state of the method, which is the process state shown in FIG. 2B. That is, the second structure 336 with the layer of cover material 328 has been planarized before and then etched in regions 356a and 356b as described above.

Figure 3B:
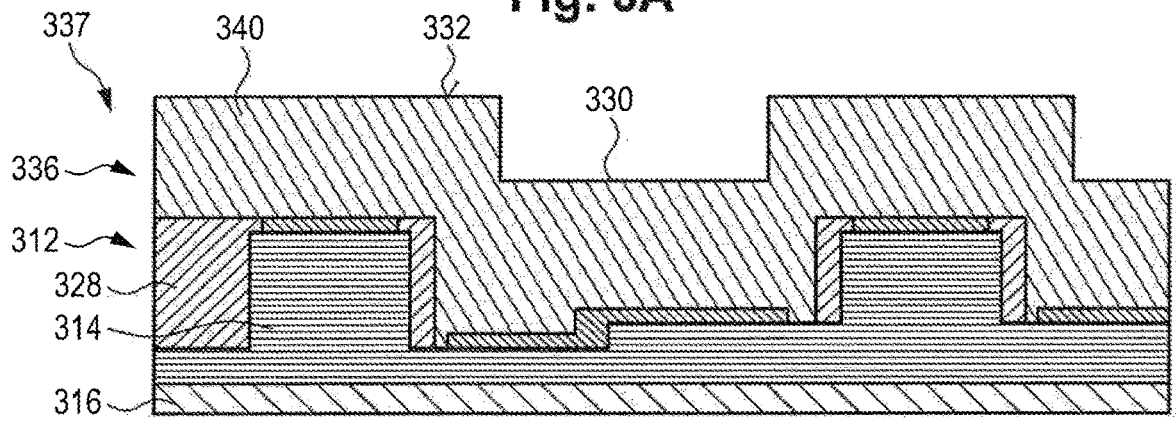
Figure 3C:
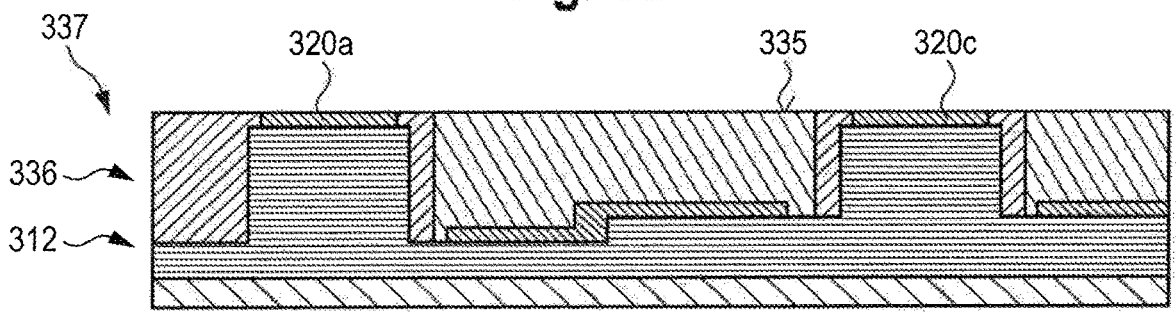
Figure 3D:
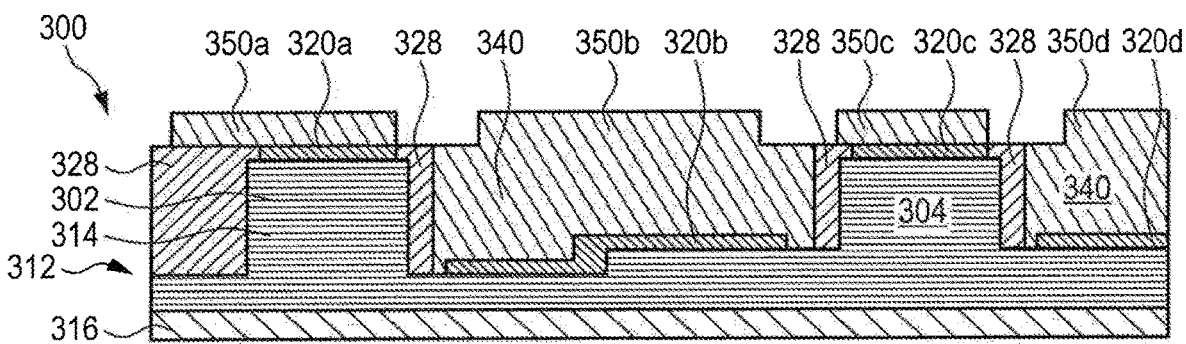

According to FIG. 3B, the VCSEL structure (second structure) 336 is covered with a further layer of cover material 340 with a thickness such that a lowest height level 330 of the cover material top surface 332 is at least equal to or above the highest level of the non-planar top surface of the second structure 336 shown in FIG. 3A. The second structure 336 and the cover material 340 form a third structure 337. The cover material 340 here is a metallic material, e.g. Au. Next, the top surface 332 of the third structure is worked, in particular polished, e.g. using chemical mechanical polishing with a slurry. The slurry may include particles inside the polishing liquid suitable for polishing the metallic cover material 340. As shown in FIG. 3C, the metal polishing is stopped at the surface of the mesas 302, 304, creating an inherent electrical isolation, by the electrically isolating material 328, between the lower altitude areas in the regions 356a, 356b and the top of the VCSEL mesas 302, 304. The final external metallization or bonding areas 350a, 350b, 350c, 350d shown in FIG. 3D can then be applied on a flat VCSEL device uppermost top surface 335, while the contact areas 320b, 320d in the regions 356a, 356b are filled with the metallic material 340.

Figure 4A:
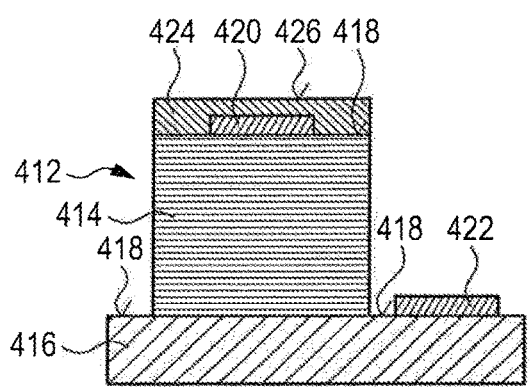
Figure 4B:
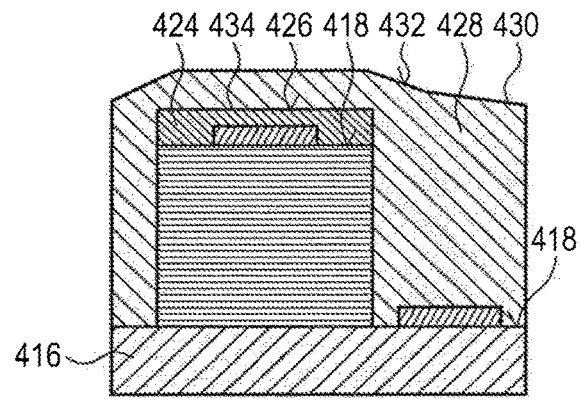
Figure 4C:
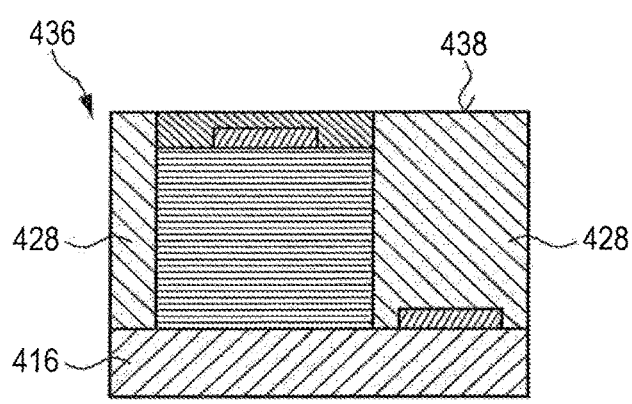
Figure 4D:
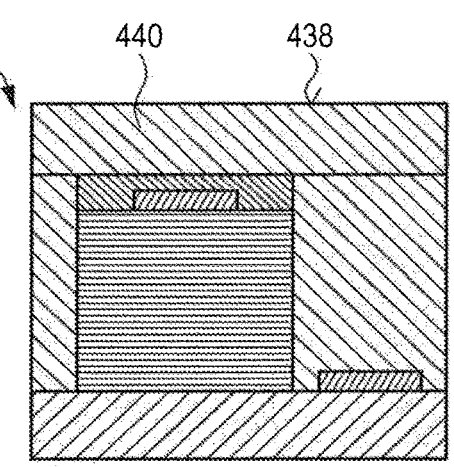
Figure 4E:
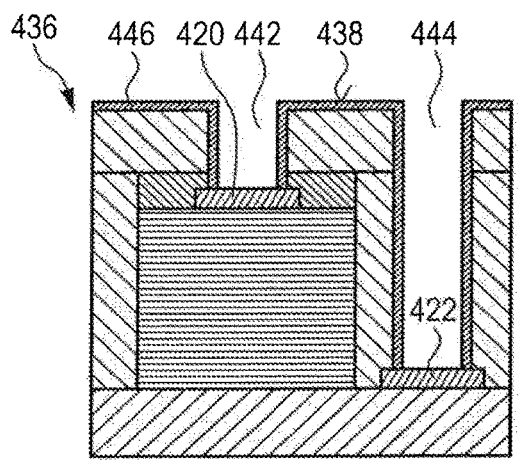
Figure 4F:
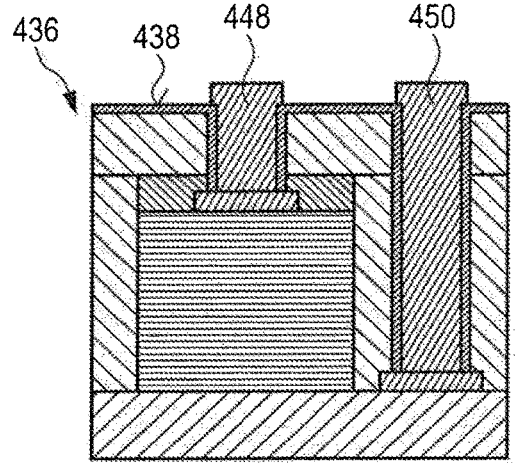
Figure 4G:
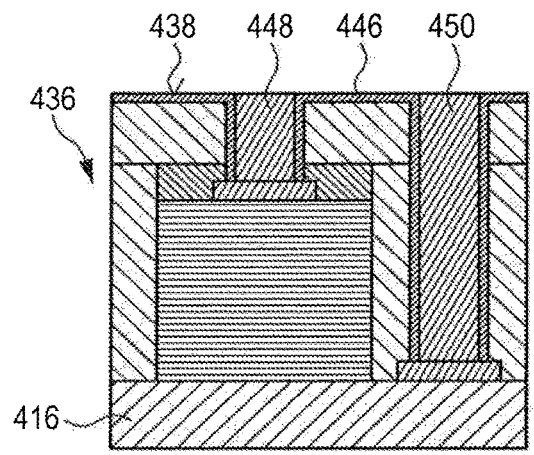
Figure 4H:
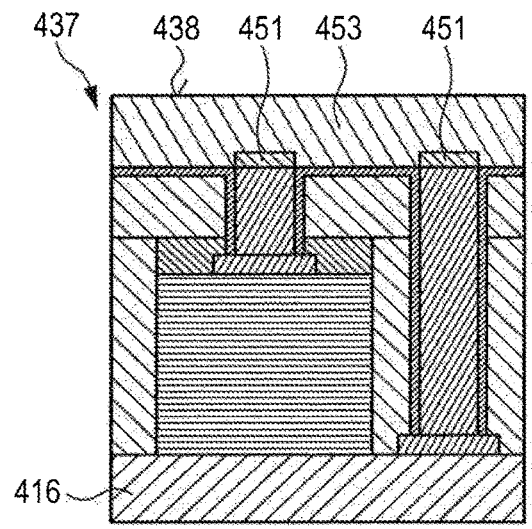
Figure 4I:
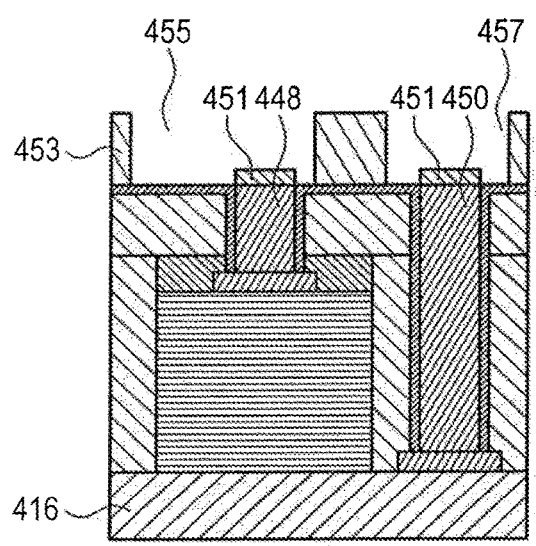
Figure 4J:
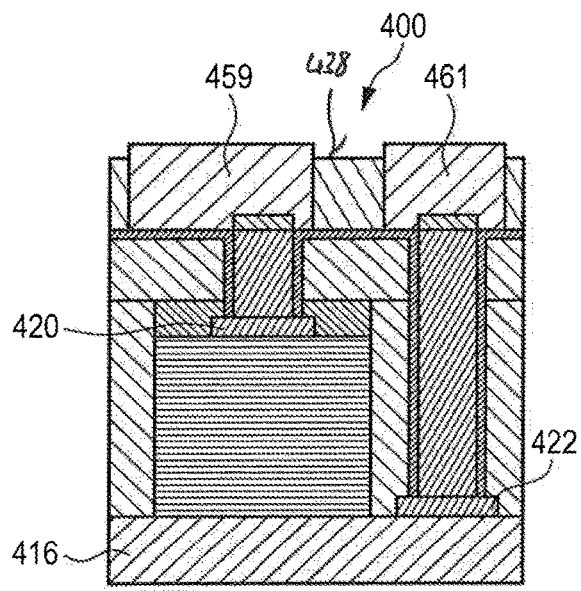

With reference to FIGS. 4A-4J, another embodiment of a method of manufacturing a VCSEL device 400 shown in FIG. 4J will be described.

According to FIG. 4A, a first structure 412 comprising a VCSEL layer structure 414 on a wafer 416 is provided. The VCSEL layer structure 414 including the wafer 416 comprises one or more semiconductor materials. The VCSEL layer structure 414 may comprise distributed Bragg reflectors and an active region with one or more quantum wells. The VCSEL layer structure 414 may have p- and n-regions. The first structure 412 has a non-planar first structure top surface 418 with varying height levels along the non-planar top surface 418. The non-planar first structure top surface 418 comprises electrical contact areas 420, 422 arranged on different height levels on the first structure top surface 418. According to FIG. 4A, a working stop layer 424 is applied onto the first structure top surface 418 in the regions thereof with the highest height level as shown in FIG. 4A. A top surface 426 of the working stop layer 424 forms the top surface of the first structure 412 in this case.

As shown in FIG. 4B, a layer of cover material 428 different from the semiconductor materials of the first structure 412 is applied on the non-planar first structure top surface 418, 426 with a thickness such that the lowest height level 430 of a cover material top surface 432 is at least equal to or above the highest height level 434 of the top surface 418, 426.

As shown in FIG. 4C, the second structure 436 comprising the first structure 412 and the cover material 428 is planarized by working the cover material top surface 432 to provide the second structure 436 with a planar second structure top surface 438. Working the cover material top surface 438 is carried out by polishing, in particular chemical mechanical polishing the cover material top surface 438 as described above. According to FIG. 4D, a layer of cover material 440 is applied on the planarized second structure 436. As to the materials of the layer 424, the cover material 428 and the cover material 440, reference is made to the description of the embodiment in FIGS. 1A-1G.

According to FIG. 4E, contact holes 442, 444 are produced directly above the contact areas 420, 422. A protective coating 446 is applied onto the planar second structure top surface 438 as described above. Vias 448, 450 are then produced by filling the contact holes 442, 444 with an electrically conductive material. In the present embodiment, the electrically conductive material is for example Au which is galvanically filled into the contact holes 442, 444.

Up to here, the process sequence shown in FIGS. 4A-4F may be identical to the process sequence shown in FIGS. 1A-1G, and as far as not indicated otherwise, the description of the method according to FIGS. 1A-1G also applies to the method steps shown in FIGS. 4A-4F.

FIG. 4G-4J show a further process sequence which may be carried out starting from FIG. 4F.

According to FIG. 4G, the second structure top surface 438 is planarized again by chemical mechanical polishing the electrically conductive materials forming the vias 448, 450 with a suitable slurry. The polishing does not attack the protective coating 446.

Next, as shown in FIG. 4H, a material 451 is deposited on the vias 448, 450 which has the function of a defusion stop. The material 451 may be an electrically conductive ceramic material, wherein TiN can be advantageously used as the material 451. Further, as shown in FIG. 4H, the second structure is covered with an electrically isolating material 453 to provide a third structure 437 which now has the planar top surface 438. The VCSEL layer structure now is encapsulated.

In FIG. 4I, contact holes 455, 457 are etched into the cover material 453 so that the vias 448, 450 including the diffusion stops 451 are exposed. FIG. 4J shows the filling of the contact holes 455, 457 with an electrically conducting material, e.g. copper, to provide vias 459, 461 in electrical connection with the vias 448, 450 and thus with the contact areas 420, 422. The vias 459, 461 can be used as bonding areas with sufficient area for applying soldering balls onto the vias 459, 461, in order to provide external connection to a driver (not shown). Again, the uppermost top surface 438 of the VCSEL device 400 is planar.

The VCSEL device 400 is a single mesa VCSEL device. The VCSEL device 400 is a bottom emitter, i.e. laser radiation generated by the VCSEL is emitted through the substrate or wafer 16.

With reference to FIGS. 5A-5D, an embodiment of a method of fabricating a VCSEL device 500 will be described which exemplarily shows that by repeating the planarization sequence multiple times, electrical connection of multiple VCSELs or multiple mesas at different height levels or altitudes can be achieved. In every planarization and metallization sequence, another part of the mesas (VCSELs) may be connected together, while the external connection to the driver is done at a higher altitude.

Figure 5A:
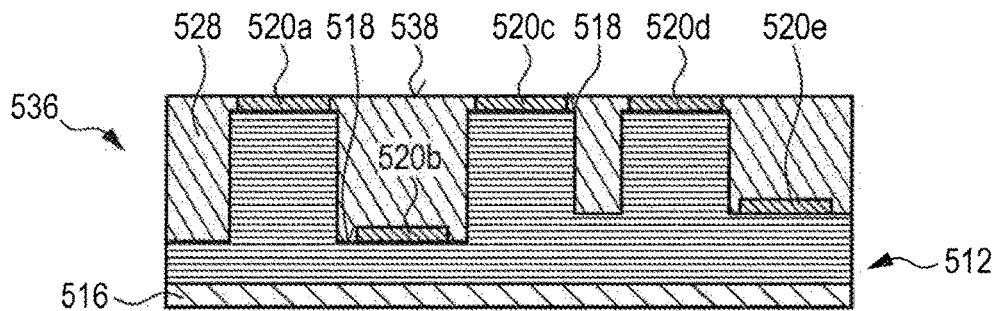
Figure 5B:
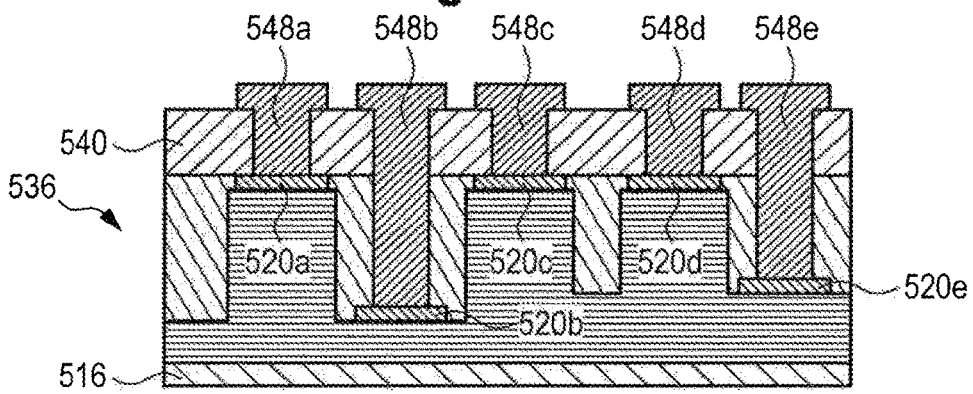
Figure 5C:
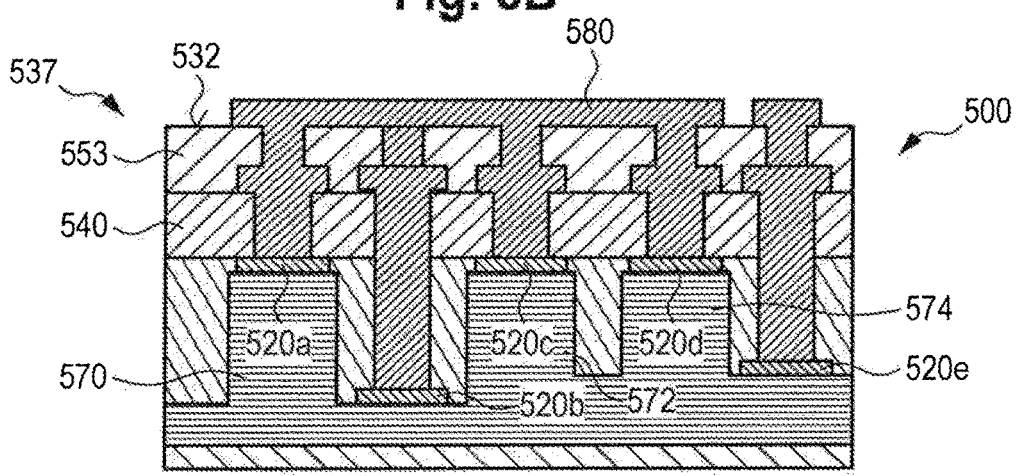
Figure 5D:
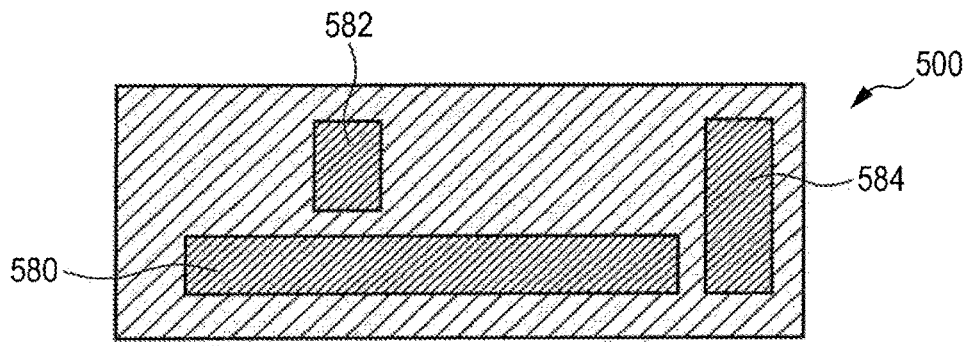

The VCSEL device 500 shown in FIG. 5C comprises, as an example, three mesas or VCSELs 570, 572, 574 each enabled to emit laser radiation.

FIG. 5A shows a processing state of the method of fabricating the VCSEL device 500, in which a first structure 512 comprising a VCSEL layer structure 514 on a wafer 516 and having a non-planar top surface 518 with electrical contact areas 520a-520e has already been covered (a stop layer below the cover material may have been applied before (not shown) like in the first embodiment in FIG. 1A-1G) with an electrically isolating cover material 528 and planarized to provide a second structure 536 with a planar second structure top surface 538. The processing state of the method in FIG. 5A corresponds to the processing state of the method shown, for example, in FIG. 4C.

As shown in FIG. 5B, the method proceeds with applying a further layer of cover material 540, contact hole etching and contact hole filling with an electrically conducting material to provide vias 548a-548e through the second structure top surface 538 down to the contact areas 520a-520e directly above the contact areas 520a-520e. The state of the method shown in FIG. 5B is similar to the state of the method shown in FIG. 4F.

Next, as shown in FIG. 5C, a further layer of cover material 553 is applied onto the structure shown in FIG. 5B to provide a third structure 537 having a third structure top surface 532 forming the uppermost top surface of the fabricated VCSEL device 500, and contact hole etching is repeated as well as contact hole filling with an electrically conductive material. On top of the third structure top surface 532, bonding areas or pads 580, 582, 584 are produced. The bonding pad 580 is electrically connected to and electrically connects the electrical contact areas 520a, 520c and 520d in parallel, while contact pad 582 is in electrical connection with electrical contact area 520b, and bonding pad 584 is electrically connected with contact area 520e (see also FIG. 5D). This exemplary embodiment shows that the method according to the principles of the present disclosure allows for fabricating densely packed VCSEL arrays with highly reduced footprint of the bonding areas.

The method according to the principles described herein also allows for making electrical connections between a plurality of mesas or VCSELs at deeper altitudes, i.e. to make internal connections within the VCSEL device. This will be described hereinafter, first with reference to FIGS. 6A-6H.

Figure 6A:
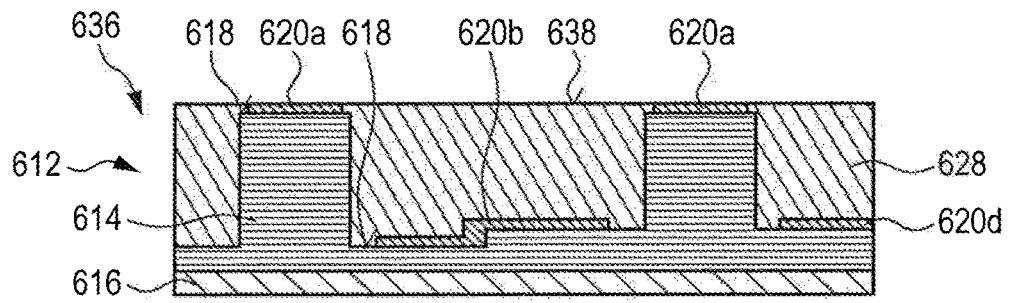
Figure 6B:
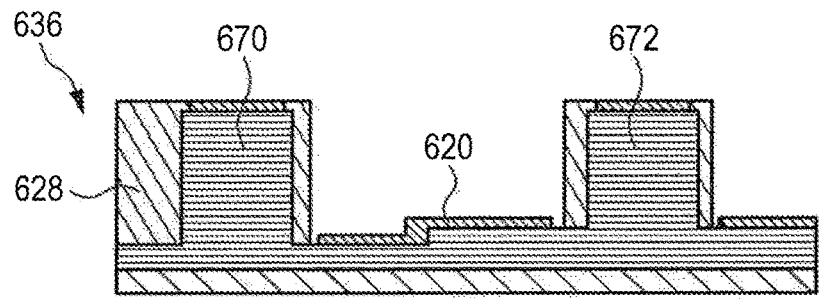
Figure 6C:
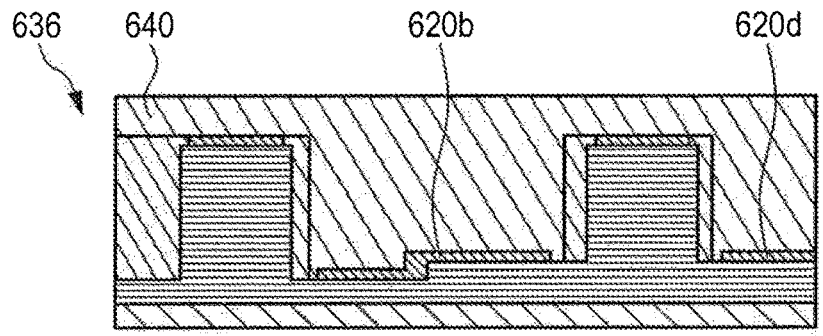
Figure 6D:
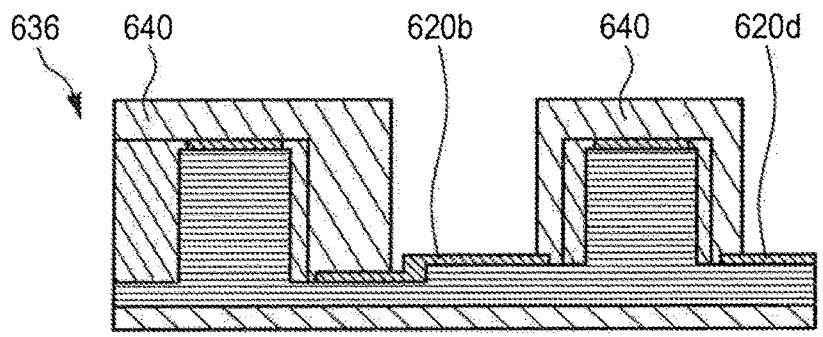
Figure 6E:
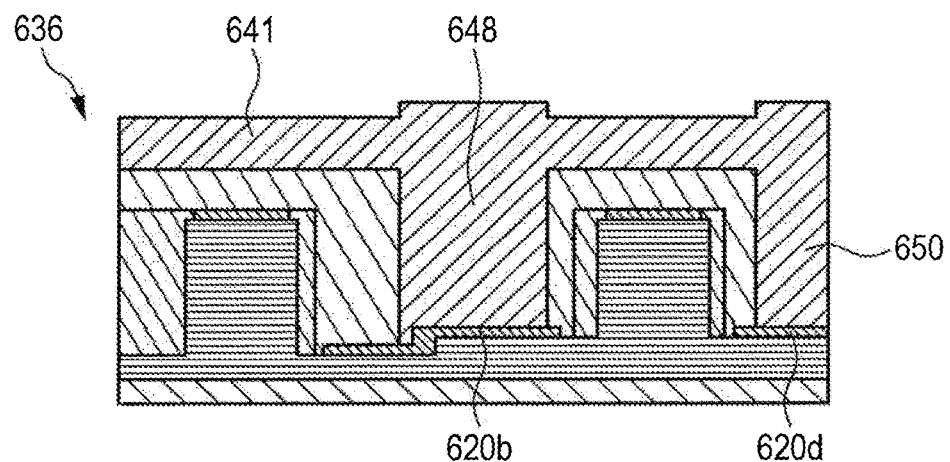
Figure 6F:
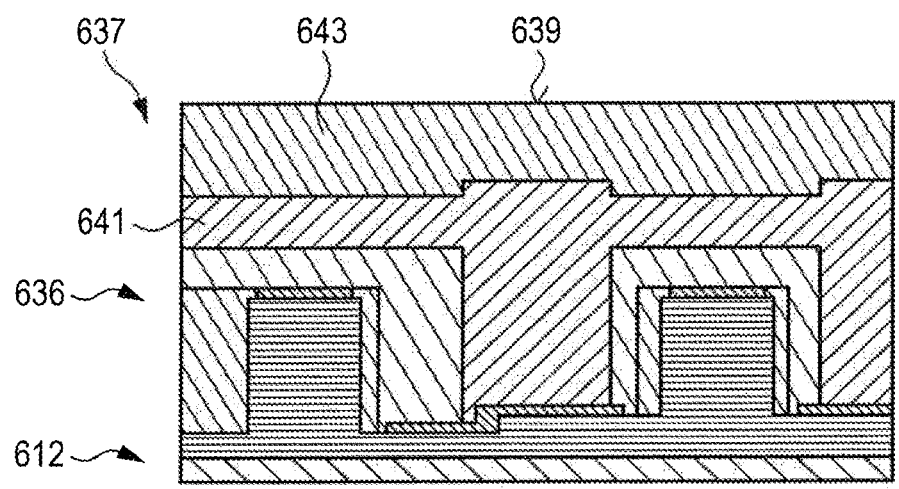
Figure 6G:
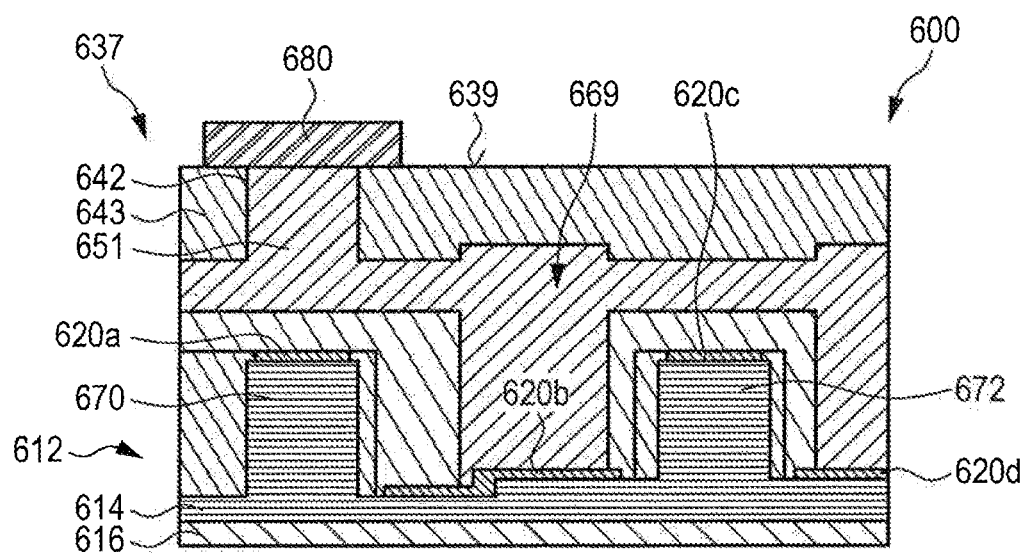

FIG. 6G shows a VCSEL device 600. The VCSEL device 600 comprises a first structure 612 comprising a VCSEL layer structure 614 comprising two mesas 670, 672, on a wafer 616. The first structure 612 comprises electrical contact areas 620a-620d. Within the VCSEL device 600, an internal electrical link 669 electrically connects the electrical contact areas 620b, 620d arranged at a low altitude in the VCSEL device 600, in parallel. In the following, an embodiment of a method to fabricate the VCSEL device 600 will be described with reference to FIG. 6A-6F.

The description starts with a processing state of the method which corresponds to the processing state in FIG. 2A described above. That is, a planarized second structure 636 has already been formed before, comprising a first structure 612 comprising a VCSEL layer structure 614 on a wafer 616. Contact areas 620a-620c are arranged on the first structure 612. The first structure 612 has a non-planar first structure top surface 618, while the second structure 636 has been planarized by working, in particular by chemical mechanical polishing, a cover material 628 applied onto the first structure 612. The cover material 628 is electrically isolating.

As shown in FIG. 6B, the second structure 636 is etched so that the deeper lying electrical contact areas 620b and 620d are exposed, while a part of the remaining cover material 628 electrically isolates the mesas 670, 672 of the VCSEL layer structure 614.

The second structure 636 is covered with a further layer of cover material 640 which is an electrically isolating material, as shown in FIG. 6C.

As shown in FIG. 6D, the second structure 636 is etched to expose the electrical contact areas 620b and 620d again, while the mesas 670, 672 are electrically isolated from the contact areas 620b and 620d also by the cover material 640. As shown in FIG. 6E, the second structure 636 is covered with a metallic material or metallization 641 which electrically connects the electrical contact area 620b with the electrical contact area 620d by forming electrical vias 648, 650 to the electrical contact areas 620b and 620d.

As shown in FIG. 6F, a further layer of cover material 643 is applied on top of the metallization 641, to create a third structure 637, comprising the second structure 636 and the first structure 612, as shown in FIG. 6F. The further cover material 643 is an electrically isolating material, and may be a material like the electrically isolating cover materials described with reference to FIG. 1A-1G above.

The third structure 637 has a third structure top surface 639 which is planar and forms the uppermost top surface of the fabricated VCSEL device 600, wherein the top surface 639 may have been planarized by chemical mechanical polishing.

Next, as shown in FIG. 6G, the third structure 637 is etched to provide a contact hole 642 which is then filled with an electrically conductive material, which may be the same as the material used for the metallization 641. The metallization 641 may be Au.

Finally, a bonding area or pad 680 is arranged on the via 651.

Figure 6H:
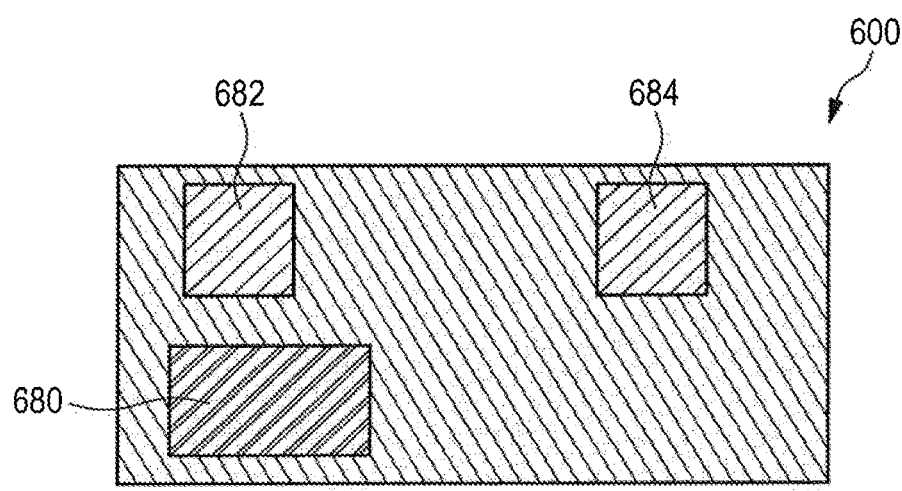

FIG. 6H shows a top view of the VCSEL device 600 which illustrates the bonding area 680 as well as two further bonding areas 682, 684, wherein the bonding area 682 is arranged for electrical connection with the electrical contact area 620a and the bonding area 684 is arranged for electrical connection with the electrical contact area 620c.

Thus, it has been shown that internal electrical links like link 669 can be made with the method according to the principles of the present disclosure.

Figure 7:
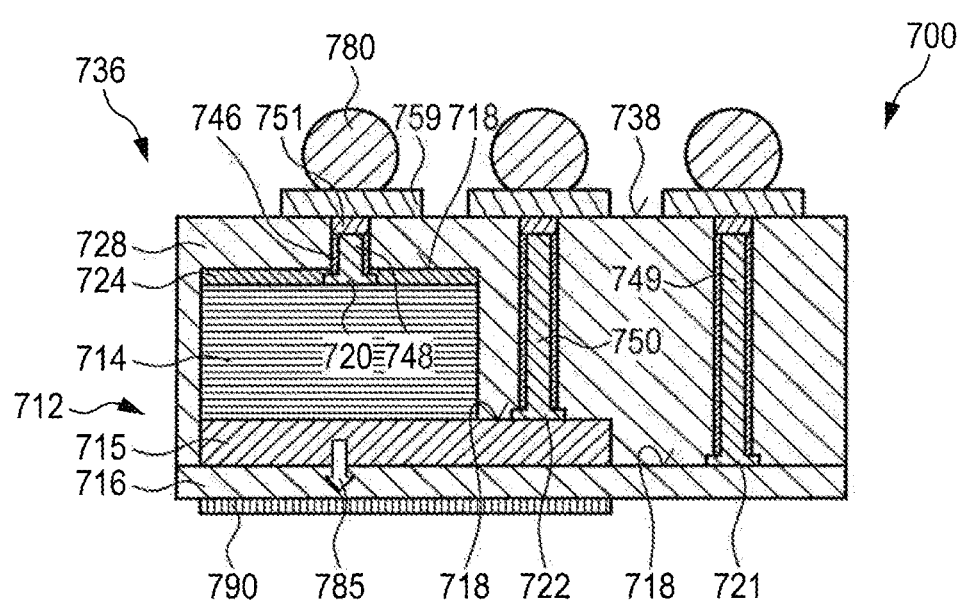
FIG. 7 show a side view of another embodiment of a VCSEL device fabricated according to embodiments of the present invention.

FIG. 7 shows an embodiment of a planarized VCSEL device 700 fabricated according to the principles of the present disclosure. The VCSEL device 700 is an example in which a photonic component like a photodiode is integrated in the planarized VCSEL device 700.

The VCSEL device 700 comprises a first structure 712 comprising a wafer 716 and formed thereon a VCSEL layer structure 714. The first structure 712 also comprises a photodiode layer structure 715. The first structure 712 has a first structure top surface 718 which is non-planar as in the embodiments described above. The first structure top surface 718 is also formed in part by a surface of the photodiode layer structure 715. The first structure 712 also comprises electrical contact areas 720, 721, 722, which are arranged at different height levels above the wafer 716. The VCSEL device 700 is encapsulated by a layer of electrically isolating cover material 728 made as described above. The layer of cover material 728 together with the first structure 712 forms a second structure 736 having a planarized second structure top surface 738 which forms the uppermost top surface of the VCSEL device 700. The second structure 736 has been fabricated as described above. Also shown in FIG. 7 is a working (polishing) stop layer 724 applied before applying the layer of cover material 728. A protective coating 746 as well as electrical vias 748, 749, 750 have been produced as described above. Fusion stops 751 on the top surfaces of the respective vias 748, 749, 750 are also shown in FIG. 7.

Bonding areas 759 are arranged on the second structure top surface 738 in electrical connection with the vias 748, 749, 750. Solder balls 780 are arranged on the bonding areas 759 for connection to an external driver (not shown).

The VCSEL device 700 is a bottom emitter, i.e. laser light is emitted by the active region of the VCSEL layer structure 714 through the photodiode layer structure 715 as indicated with an arrow 785. A grating 790 or other optical structures may be arranged at the light-emitting side of the VCSEL device 700.

FIG. 7 shows that the method of fabricating a VCSEL device according to the principles of the present disclosure also is suitable for integrating photonic components like a photodiode or phototransistor in the VCSEL device 700, since all electrical connections to external devices can be made on a planarized surface (surface 738) of the VCSEL device 700 in a space-saving manner.

Figure 8:
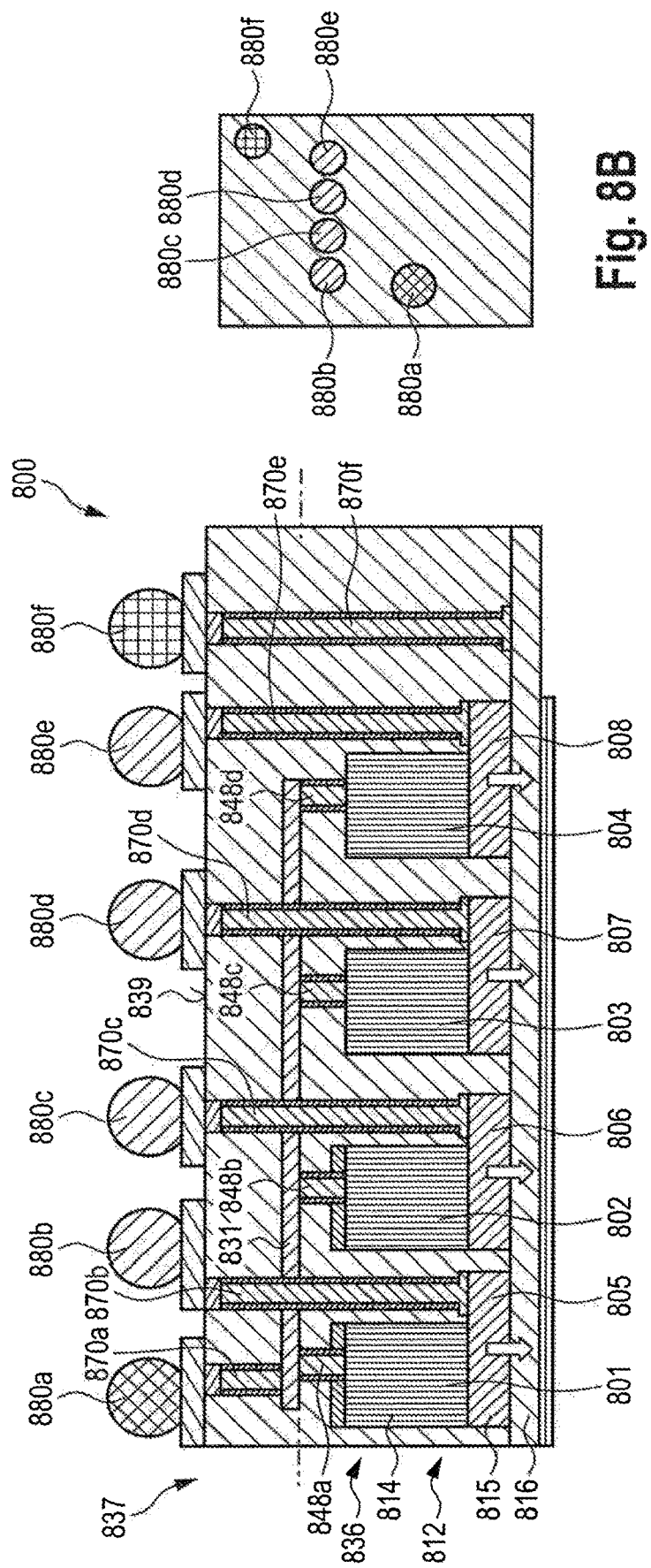

While the VCSEL 700 in FIG. 7 is a single-mesa VCSEL device, FIGS. 8A and 8B show a multi-mesa VCSEL device 800, wherein each mesa may be equipped with an integrated photodiode. The VCSEL 800 comprises in this example a first structure 812 comprising a VCSEL layer structure 814 on a wafer 816 including a photodiode layer structure 815. The first structure 812 has been etched to obtain four mesas 801, 802, 803, 804 and a corresponding number of photodiodes 805, 806, 807, 808. Each of the mesas 801, 802, 803, 804 including the corresponding photodiode 805, 806, 807, 808 resembles the VCSEL device 700 in FIG. 7. However, differently from the VCSEL device 700, the VCSEL device 800 comprises an internal electrical link 831. Such an internal electrical link is advantageously possible by the method of fabricating the VCSEL device 800 in accordance with the principles of the present disclosure. Such an internal electrical link may be produced by repeating the planarizing sequence including applying layers of cover material and planarizing them several times as described, for example, with reference to FIG. 6A-6H above. After a first planarization step, first electrical vias 848a to 848d down to the electrical contact areas on the layer structure 814 of the mesas 801-804 are produced and electrically connected to one another by applying an electrically conductive material, for example a metal, in order to create the electrical link 831. Then, after the next planarization process including covering the second structure 836 with a further layer of cover material to provide a third structure 837 and planarizing the third structure 837 to provide a planar uppermost top surface of the device 800, further electrical vias 870a-870e are produced in the third structure 837. As shown in FIG. 8A, one of these further vias 870a extends down to the electrical link 831 while electrical connection of the via 870a to the vias 848a, 848b, 848c, 848d is accomplished by the electrical link 831. Further electrical vias 870b-870e have been produced which extend from the third structure top surface 839 down to the electrical contacts arranged on the photodiodes 805-808. A further electrical via 870f extends from the third structure top surface 839 down to the wafer 816. Thus, the method of fabricating a VCSEL device like the VCSEL device 800 enables densely packed multi-mesa VCSEL devices, whereby dark spots in the laser emission are avoided or at least reduced. Further, as shown in FIG. 8A, the method according to embodiments of the present invention allows providing internal electrical links within a VCSEL device, like the internal electrical link 831.

As shown in the top view of the VCSEL device 800 in FIG. 8B, the bonding areas including the solder balls 880a-880f are all arranged on the top surface of the VCSEL device 800 without requiring much space reducing the footprint of the VCSEL device 800, in particular the footprint of the electrical connections.

Figure 9:
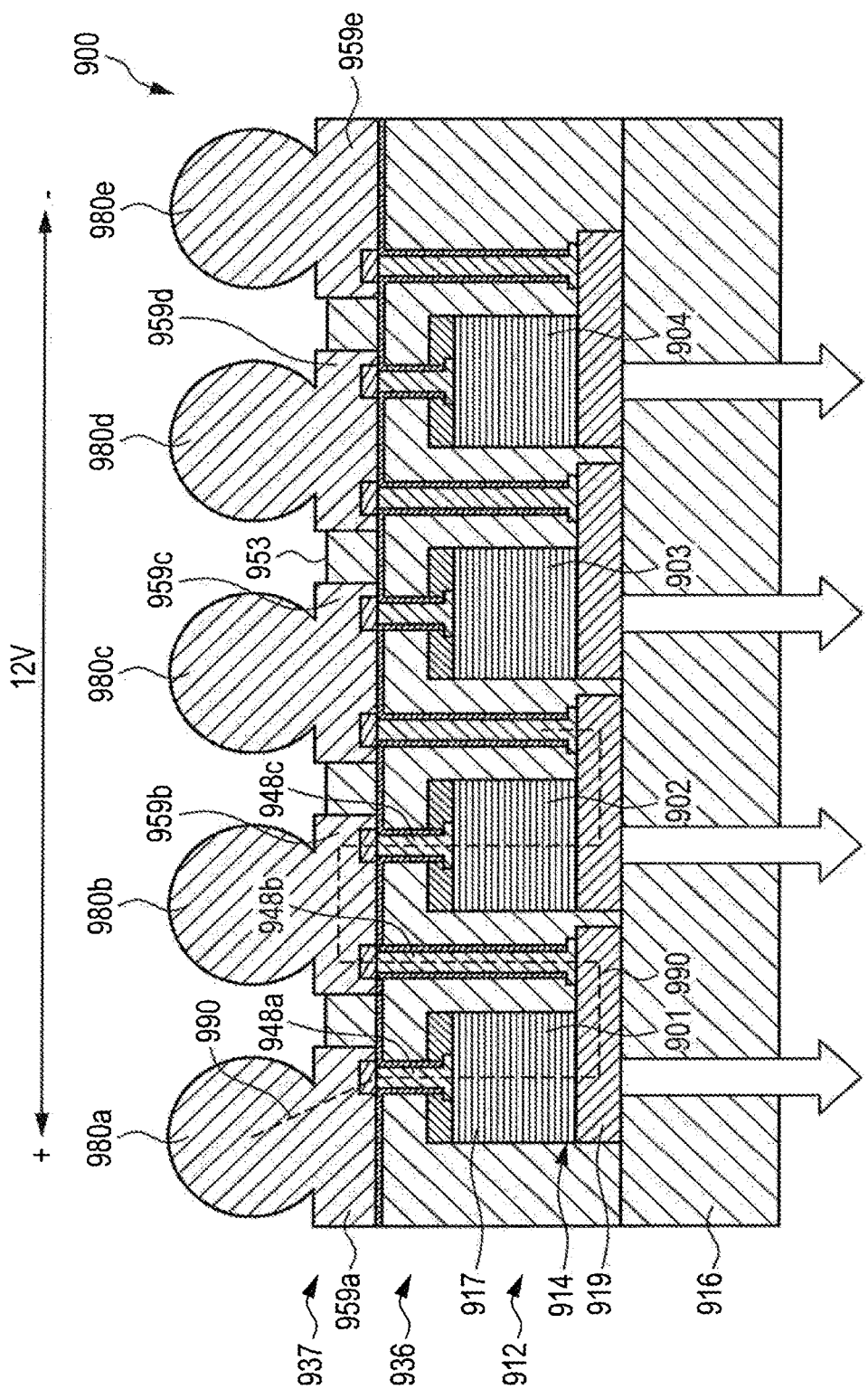
FIG. 9 shows a side view of a VCSEL device fabricated according to embodiments of the present invention.

FIG. 9 shows an embodiment of a cascaded VCSEL device 900 fabricated in accordance with the principles of the present disclosure, in which multiple mesas or VCSELs are electrically connected in series with one another. The VCSEL device 900 comprises a first structure 912 comprising a VCSEL layer structure 914, which has a region 917 of a first polarization type, for example p-type, and another region with a second polarization type, for example an n-type region 919. The VCSEL device 900 comprises a second structure 936, which is formed from the first structure 912 by a planarizing process as described above. The first structure 912 also comprises a wafer 916.

The VCSEL device 9 further comprises a third structure comprising a further layer of cover material 953.

The VCSEL device 900 comprises in this example four mesas 901-904. Each mesa has a structure comparable with the VCSEL structure shown in FIG. 4J described above. Vias 959a-959e are produced in the cover material layer 953. The vias 959b, 959c and 959d electrically connect adjacent mesas with one another. The whole arrangement is made such that the mesas are electrically connected in series, so that a cascade of mesas is formed. When connecting the bonding area 980a formed as a solder ball and 980e with the positive and negative poles of a voltage source, the voltage (for example 12V) drops along the VCSEL device 900. The current flows through the single mesas 901, 902, 903, 904 in series, as indicated with a broken partial line 990.

The further solder balls 980b, 980c, 980d as well as the solder balls 980a, 980e also serve as heat sinks, so that each emitter (mesa) has its own heat sink.

Figure 10:
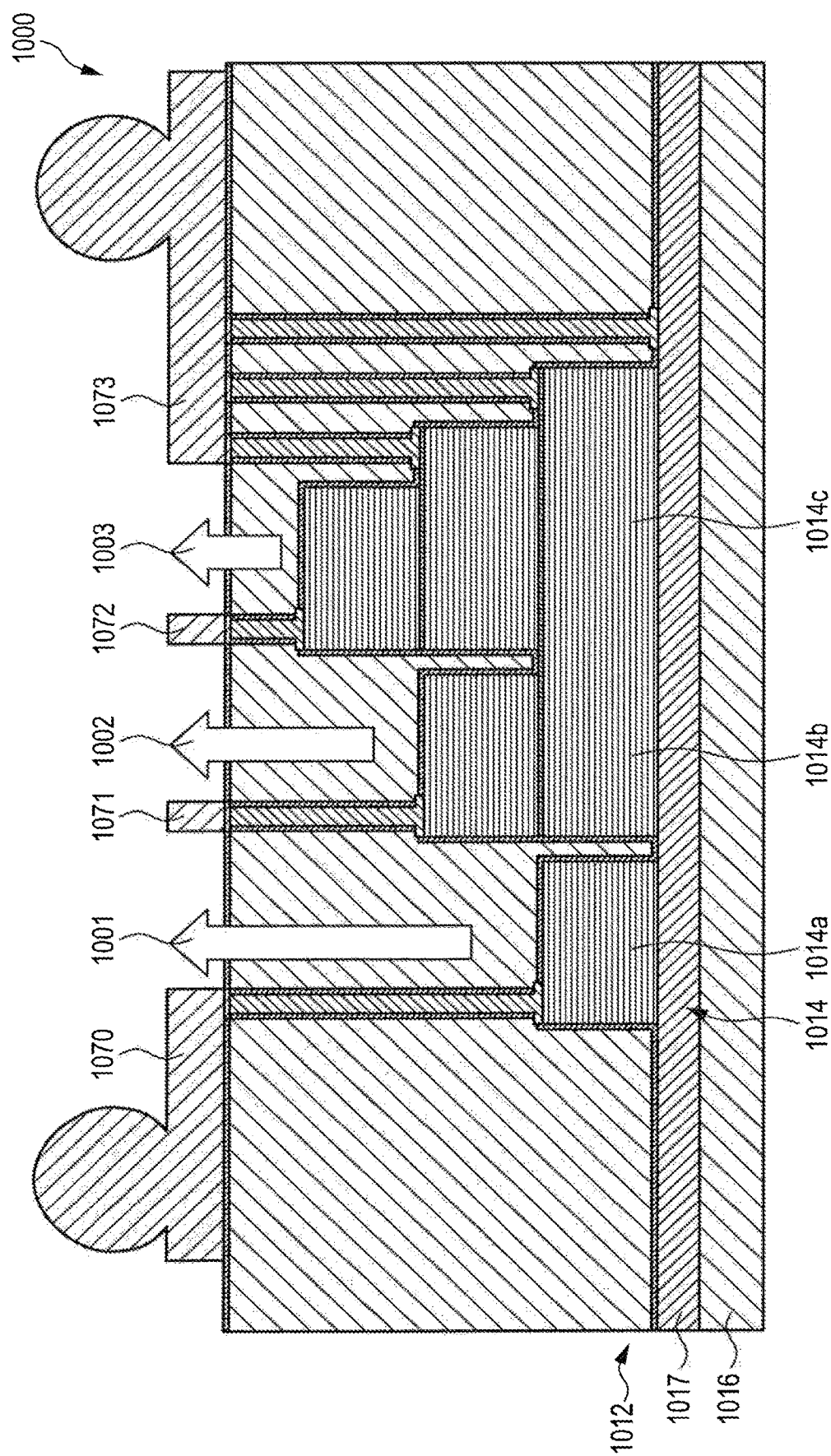
FIG. 10 shows a side view of a VCSEL device fabricated according to embodiments of the present invention.

FIG. 10 shows an embodiment of a VCSEL device 1000 which is arranged for laser light emission in a plurality of different wavelength bands, for example in a first wavelength band with a peak emission at 980 nm, a second wavelength band with a peak emission at 960 nm, and a third wavelength band with a peak emission at 940 nm.

The regions of the VCSEL device 1000 with the emissions in the different wavelength bands are indicated by arrows 1001, 1002, 1003. In particular, the VCSEL device 1000 is a top emitter.

The VCSEL 1000 may be fabricated in accordance with the principles of the present disclosure, i.e. by providing a first structure comprising a VCSEL layer structure 1014 with regions 1014a, 1014b, 1014c in accordance with the number of emission peak wavelengths of the laser emission. The VCSEL layer structure 1014 comprises, for example, an n-type doped layer 1017 common to all regions 1014a, 1014b, 1014c. The first structure 1012 further comprises a wafer or substrate 1016. The VCSEL device 1000 may fabricated in accordance with the principles of the present disclosure by using a planarizing sequence as described above, and producing electrical vias from the structure top surface down to the electrical contact areas as shown in FIG. 10. The VCSEL device 1000 has bonding areas 1070, 1071, 1072, 1073 for electrically connecting the VCSEL device 1000 to an external driver, wherein the regions 1001, 1002, 1003 are individually addressable.

As it becomes apparent from the description herein, the method of fabricating a VCSEL device according to embodiments of the present invention enables a multitude of different configurations of VCSEL devices with low manufacturing expenditure. In particular, the method allows for VCSEL devices with a small footprint of the VCSEL chip. The method allows for fabricating VCSEL devices with individually addressable VCSELs or mesas in a highly dense pack, allows photonic component integration, and complex internal electrical routing.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of fabricating a Vertical Cavity Surface Emitting Laser (VCSEL) device, the method comprising:
   providing a first structure comprising a VCSEL layer structure on a wafer, the first structure including the wafer comprising one or more semiconductor materials, the first structure having a non-planar first structure top surface with varying height levels along the non-planar top surface, wherein the non-planar first structure top surface comprises one or more electrical contact areas at different height levels above the wafer;

applying one or more layers of a cover material that is different from the one or more semiconductor materials on the non-planar first structure top surface with a thickness such that a lowest height level of a cover material top surface is equal to or above the highest height level of the non-planar first structure top surface, to obtain a second structure comprising the first structure and the one or more layers of cover material, the second structure having a second structure top surface;

planarizing the second structure top surface; and producing one or more first electrical vias from the second structure top surface through the one or more layers of cover material for electrical connection to the one or more electrical contact areas.

2. The method of claim 1, wherein the planarizing comprises polishing the second structure top surface.

3. The method of claim 2, wherein the polishing comprises chemical mechanical polishing.

4. The method of claim 1, wherein at least one of the one or more layers of cover material is electrically isolating.

5. The method of claim 1, wherein at least one of the one or more layers of cover material is a metal layer.

6. The method of claim 1, wherein at least one of the one or more layers of cover material is thermally conducting.

7. The method of claim 1, wherein the producing the one or more first electrical vias comprises etching one or more contact holes into the one or more layers of cover material down to the one or more electrical contact areas, and filling the one or more contact holes with an electrically conducting material up to the second structure top surface.

8. The method of claim 1, further comprising, after producing the one or more first electrical vias, applying at least one further layer of cover material on the second structure to provide a third structure comprising the second structure and the further cover material and having a third structure top surface.

9. The method of claim 8, further comprising producing further electrical vias from the third structure top surface through the at least one further layer of cover material for electrically connecting the one or more further electrical vias with at least a part of the first electrical vias.

10. The method of claim 8, further comprising, prior to applying the at least one further layer of cover material, electrically connecting at least a part of the first electrical vias with one another.

11. The method of claim 1, further comprising arranging one or more bonding areas on the second structure top surface or on the third structure top surface in electrical connection with the first or further electrical vias.

12. The method of claim 1, wherein the one or more semiconductor materials are II-VI or III-V compound semiconductor materials.

* * * * *